US007652538B2

(12) United States Patent
Choi

(10) Patent No.: US 7,652,538 B2
(45) Date of Patent: Jan. 26, 2010

(54) CIRCUITS AND METHODS FOR IMPROVING SLEW RATE OF DIFFERENTIAL AMPLIFIERS

(75) Inventor: Yoon-Kyung Choi, Yongin (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 282 days.

(21) Appl. No.: 11/228,998

(22) Filed: Sep. 16, 2005

(65) Prior Publication Data

US 2006/0091955 A1 May 4, 2006

(30) Foreign Application Priority Data

Sep. 24, 2004 (KR) ..................... 10-2004-0077156

(51) Int. Cl.
*H03F 1/14* (2006.01)

(52) U.S. Cl. ...................................... 330/292; 330/260

(58) Field of Classification Search ................ 330/260, 330/292

See application file for complete search history.

(56) References Cited

U.S. PATENT DOCUMENTS 4,315,223 A 2/1982 Haque
5,311,145 A 5/1994 Huijsing et al. ............. 330/255
5,359,294 A 10/1994 Ganger et al. ............... 330/258
5,731,739 A 3/1998 Ho
6,657,496 B2 12/2003 Chen et al. .................. 330/263
6,977,549 B2 * 12/2005 Tsuchi ....................... 330/257
7,573,333 B2 * 8/2009 Yokota ....................... 330/255
2003/0160749 A1 8/2003 Tsuchi

FOREIGN PATENT DOCUMENTS

KR 1020040057491 7/2004

OTHER PUBLICATIONS

Korean Patent Abstracts for Publication No. 1020040057491, published on Jul. 2, 2004.
Ron Hogervorst et al., *A Compact Power-Efficient 3 V CMOS Rail-to-Rail Input/Output Operational Amplifier for VLSI Cell Libraries*, IEEE Journal of Solid-State Circuits, vol. 29, No. 12, Dec. 1994.
Preliminary Notice of the First Office Action dated Dec. 24, 2007 and Search Report for Patent Application No. 094133054.
Notice of Office Action issued by Chinese Patent Office dated Sep. 26, 2008 in corresponding Chinese application.

* cited by examiner

*Primary Examiner*—Robert Pascal
*Assistant Examiner*—Alan Wong
(74) *Attorney, Agent, or Firm*—F.Chau & Associates, LLC

(57) ABSTRACT

Circuits and methods are provided for providing high speed operational amplifiers and, in particular, operational amplifiers having frequency compensation circuits that provide improved slew rates with low power dissipation when configured with feedback. Frequency compensation schemes are provided to enable dynamic configuration of frequency compensation circuits implementing miller compensation whereby nodal connections of compensation capacitors are changed during driver setup and driving periods such that compensation capacitors are connected to source voltages to rapidly charge/discharge compensation capacitors using supply source currents during setup period, while providing frequency compensation during the setup and driving periods to maintain circuit stability and prevent oscillation of an output voltage due to the feedback.

20 Claims, 7 Drawing Sheets

VDD 200 ITR1 VB1 IB1 CTR1 CTR2 CTRL1 SW11 SW21 N1' N1 N11 CTR3 CTR4 VB2 CTRL2 PUTR C21 N10 BTR2 INP INN NC1 BTR1 VB3 C11 NOUT SW3 PD R DTR11 DTR21 N20 DTR22 DTR12 BTR4 VB4 C12 CTRL2 C BTR3 NC2 C22 CTRL2 CTR5 VB5 PDTR CTR6 N2' N2 N22 SW22 ITR2 CTR7 CTR8 CTRL1 SW12 VB6 IB2 130 110 VSS 120 240

200
130
240
120
110
VDD
VSS
C
R
PD
SW3
CTRL2
NOUT
PUTR
PDTR
SW11
SW12
SW21
SW22
CTRL1
N11
N22
C11
C12
C21
C22
VB1
VB2
VB3
VB4
VB5
VB6
CTR1
CTR2
CTR3
CTR4
CTR5
CTR6
CTR7
CTR8
N1
N1'
N2
N2'
NC1
NC2
BTR1
BTR2
BTR3
BTR4
INN
INP
DTR11
DTR12
DTR21
DTR22
N10
N20
ITR1
ITR2
IB1
IB2

CIRCUITS AND METHODS FOR IMPROVING SLEW RATE OF DIFFERENTIAL AMPLIFIERS

CROSS-REFERENCE TO RELATED APPLICATION

This application claims priority to Korean Patent Application No. 10-2004-0077156, filed on Sep. 24, 2004, which is incorporated herein by reference.

TECHNICAL FIELD OF THE INVENTION

The present invention relates generally to high speed operational amplifiers and, more specifically, to differential amplifiers having frequency compensation circuits that provide improved slew rates with low power dissipation.

BACKGROUND

In general, operational amplifiers are versatile integrated circuits that are commonly implemented in various types of electronic circuits. For instance, operational amplifiers are typically used as output drivers for LCD (liquid crystal display) devices, DACs (digital-to-analog converters), ADCs (analog-to-digital converters), switched capacitor filters, analog filters, etc. In LCD devices, source driver circuits are constructed using operational amplifiers as source line drivers for driving an output signal to transfer an amplified color signal to a TFT LCD panel. The source line drivers operate by differentially amplifying input signals applied to non-inverting and inverting input terminals of a differential input stage of the operational amplifiers.

With operational amplifiers, the performance and reliability of the electronic circuit depends on the slew rate, or the response speed of an output signal as function of an input signal. Currently, high resolution LCD panel displays such as QVGA (quarter video graphic array) and VGA (video Graphics Array) are continually being developed and optimized to provide increasing resolution. As the resolution increases, the activation period of the input signal to drive the TFT-LCD panel becomes shorter. As a result, it is important that the slew rate of the differential amplifier be minimized.

FIG. 1 illustrates a conventional operational amplifier (100) having a two-stage topology that provides rail-to-rail common mode range of operation at the input and output of the operational amplifier. In general, the operational amplifier (100) comprises a differential input circuit (110), a folded cascode stage (120) (gain stage) and a class AB output stage (130). The differential input circuit (110) and folded cascode stage (120) form a folded cascode OTA (operational transconductance amplifier) amplifier which amplifies the difference of two input voltages applied to a non-inverting INP and inverting INN terminals, and generates a current at the output stage (130). In addition, the operational amplifier (100) comprises a frequency compensation circuit (140) that implements a known cascoded Miller frequency compensation scheme to enhance phase margin and reduce oscillation, as is known in the art. The architecture and operation of the operational amplifier (100) is well-known in the art, and a detailed explanation is not necessary. For illustrative purposes, however, a brief description of constituent components and functions of the operational amplifier (100) will be provided hereafter.

The differential input circuit (110) is designed to provide rail-to-rail operation, wherein an input common mode voltage can vary throughout the range between the positive power supply rail voltage VDD and the negative power supply rail voltage VSS. The differential input circuit (110) comprises a first differential amplifier comprising PMOS transistors DTR11 and DTR12, a second differential amplifier comprising NMOS transistors DTR21 and DTR22, a first current source ITR1 and a second current source ITR2. The PMOS transistors DTR11 and DTR12 (of the first differential amplifier) are a matched transistor pair having a common source configuration with source electrodes commonly connected to a node N10. The first current source ITR1 is connected between the node N10 and a positive supply rail voltage VDD. The first current source ITR1 is a PMOS transistor, which sinks a bias current IB1 of the first differential amplifier so that substantially constant bias current is provided to the PMOS transistors DTR11 and DTR12. A bias control voltage VB1 input to a gate electrode of the PMOS transistor ITR1 controls the quantity of the bias current IB1 provided to the first differential amplifier.

Likewise, the NMOS transistors DTR21 and DTR22 (of the second differential amplifier) are a matched transistor pair having a common source configuration with source electrodes commonly connected to a node N20. The second current source ITR2 is connected between the common node N20 and a negative supply rail voltage VSS. The second current source ITR2 is an NMOS transistor, which sinks a bias current IB2 of the second differential amplifier so that substantially constant bias current is provided to the NMOS transistors DTR21 and DTR22. A bias control voltage VB6 input to a gate electrode of the transistor ITR2 controls the quantity of the bias current IB2 provided to the second differential amplifier. Typically, the bias control voltages VB1 and VB6 are controlled such that the bias current IB1 provided to the first differential amplifier is substantially the same value as the bias current IB2 provided to the second differential amplifier (i.e., IB1=IB2).

The gate electrodes of the transistors DTR11 and DTR21 are commonly connected to a positive (non-inverting) input terminal INP, and the gate electrodes of the transistors DTR12 and DTR22 are commonly connected to a negative (inverting) input terminal INN. The drain electrodes of the NMOS transistors DTR21 and DTR22 are output terminals connected to nodes N1 and N1' in the folded cascode stage (120). The drain electrodes of the PMOS transistors DTR11 and DTR12 are output terminals connected to nodes N2 and N2' in the folded cascode stage (120).

In general, the folded cascode stage (120) comprises a summing circuit formed of two current mirrors and a common floating current source that drives the current mirrors. In particular, the folded cascode stage (12) comprises a first set of control transistors comprising PMOS transistors CTR1, CTR2, CTR3 and CTR4 and a second set of control transistors comprising NMOS transistors CTR5, CTR6, CTR7 and CTR8. The first set of control transistors CTR1~CTR4 form a first current mirror and the second set of control transistors CTR5~CTR8 form a second current mirror. Further, bias transistors BTR1 and BTR3 form the floating current source which drives the current mirrors. An external bias voltage VB2 is applied to the gates of CTR3 and CTR4, and an external bias voltage VB5 is applied to the gates of CTR5 and CTR6. Further, external bias voltages VB3 and VB4 are applied to the gates of BTR1 and BTR3, respectively.

The summing circuit operates to add the output currents of the differential amplifiers in the differential input stage (110) so as to provide drive currents for the driver output stage (130). In particular, the first current mirror CTR1~CTR4 is loaded by the drain currents of the input pairs DTR21 and DTR22 and the second current mirror CTR5~CTR8 is loaded by the drain currents of the input pair DTR11 and DTR12. The current mirror circuits operate to mirror the output currents at nodes N1' and N2' and add these currents to the currents at nodes N1 and N2 to provide drive currents for the output stage (130).

The output stage (130) comprises a class-AB rail-to-rail output stage comprising a pair of common source connected output transistors PUTR and PDTR, which are connected to control nodes NC1 and NC2, respectively. The cascode stage (120) includes a bias control circuit formed by a complementary pair of transistors BTR2 and BTR4 to provide class AB control. The transistors BTR2 and BTR4 are connected in parallel between control nodes NC1 and NC2 to supply drive currents in parallel to the output transistors PUTR and PDTR, and are biased with bias voltage VB3 and VB4, respectively. The class-AB action is performed by maintaining the voltage between the gates of the output transistors PUTR and PDTR constant (i.e., NC1–NC2=constant). The floating current source biases the summing circuit as well as the class AB control circuit. The bias control transistors BTR2 and BTR4 and similar in structure to the floating current source transistors BTR1 and BTR3, which results in a quiescent current that is independent of the supply voltage.

The frequency compensation circuit (140) includes compensation capacitors C1 and C2, which are connected between the output node NOUT and the cascode stage (120) to provide cascoded Miller compensation, as is known in the art. The first capacitor C1 is connected between the output node NOUT and node N1 and the second capacitor C2 is connected between the output node NOUT and node N2. In general, the compensation circuit (140) operates to provide necessary compensation to maintain the stability when the operational amplifier is configured with feedback and increase the phase margin. However, the addition of the compensation capacitors introduces slewing of the output signal as a result of the time delay for charging and discharging the capacitors when driving the output node NOUT.

More specifically, in the conventional amplifier of FIG. 1, the slew rate of the output signal is predominately determined by the current IS that is available to charge and discharge the compensation capacitors C1 and C2. The slew rate of the output signal is determined as $$SR = \frac{dVo}{dt} = \frac{IS}{C1},$$

where Vo is the output voltage, where the available current IS for slewing is the bias current of the differential amplifier (IB1=IB2), and where C1=C2 is the capacitance of compensation capacitors. When designing the amplifier (100), the capacitors C1 and C2 are typically first selected using known techniques based on, e.g., amplifier gain, the frequency of operation, the load impedance, desired settling time, etc., to achieve the desired stability. The slew rate will then be determined by the bias current IB1=IB2 of the differential amplifier. For example, in conventional TFT-LCD source driver circuits that implement the differential amplifier of FIG. 1, for example, the bias current IB1=IB2 is selected so as to satisfy a maximum driver output setup time, tD, which is required when output voltage Vout swings at a maximum value.

FIG. 4 is an exemplary waveform diagram that illustrates input and output voltages of the operational amplifier (100) when configured as a single-ended, non-inverting differential amplifier with unity gain (i.e., the output node NOUT is connected to the inverting input INN of the differential amplifiers. Ideally, the output voltage waveform (denoted as PD) should track the input voltage waveform (denoted as INP). However, the rising and falling edges of the output voltage PD have sloped transitions where the slope is determined by the slew rate. In FIG. 1, the slewing of the output signal NP is due to the time required for charging/discharging the compensation capacitors C1, C2 when the output voltage at node NOUT changes from Vo1 to Vo2. In such instance, the voltage across the compensation capacitors C1, C2 must be changed by ΔV=Vo1–Vo2, which requires the capacitors C1, C2 to be charged/discharged by CΔV. The nodes of the compensation capacitors C1, C2 connected to the output node NOUT can be readily charged or discharged by the output currents that flow through PUTR and PDTR. However, the nodes of the compensation capacitors C1, C2 connected to cascode node N1 and N2 are charged/discharged by a small current IS, which has a maximum value equal to bias currents IB1=IB2, which effectively limits the slew rate.

To improve the slew rate, either the size of the compensation capacitors C1 and C2 must be decreased or the bias current of the differential amplifiers must be increased. Reducing the size of compensation capacitors C1 and C2, however, results in decreased stability and oscillation of the output voltage, which is undesirable. Although the bias currents can be increased to improve the slew rate, this is undesirable as increased bias current levels result in increased power dissipation.

SUMMARY OF THE INVENTION

In general, exemplary embodiments of the invention include high speed operational amplifiers having frequency compensation circuits that provide improved slew rates with low power dissipation. More specifically, exemplary embodiments of the invention including frequency compensation circuits implementing miller compensation, which are dynamically configured to change nodal connections of compensation capacitors during driver setup and driving periods to provide improved slew rates, while providing stable operation with low power dissipation.

In one exemplary embodiment of the invention, an operational amplifier includes a first differential amplifier input stage, a second stage having an output node NOUT, and a frequency compensation circuit connected between the output node NOUT and an output node N1 of the first differential amplifier input stage. The frequency compensation circuit comprises a first capacitor and a first and second switch. The first switch and the first capacitor are serially connected between a supply voltage rail and the output node NOUT. The second switch is connected to the output node N1 and to a node between the first switch and the first capacitor.

A control circuit generates a plurality of switch control signals when an input signal is input to a first input terminal of the differential amplifier input stage. During a first time period (output driver setup period), switch control signals are generated to activate the first switch to connect the first capacitors to the supply voltage rail, and deactivate the second switch. Thereafter, during a second time period (driving period) subsequent to the first time period, switch control signals are generated to deactivate the first switch and to activate the second switch to connect the first capacitors to the output node N1.

In another exemplary embodiment of the invention, an operational amplifier includes a first differential amplifier input stage, a second stage having an output node NOUT, and a frequency compensation circuit connected between the output node NOUT and an output node N1 of the first differential amplifier input stage. The frequency compensation circuit comprises a first capacitor, a second capacitor, and first, second and third switches. The first switch and the first capacitor are serially connected between a supply voltage rail and the output node NOUT. The second switch is connected to the output node N1 and to a node between the first switch and the first capacitor. The second capacitor is connected between the output nodes NOUT and N1, and the third switch connected between the output node NOUT and an output terminal of the operational amplifier.

A control circuit generates a plurality of switch control signals when an input signal is input to a first input terminal of the differential amplifier input stage. During a first time period (driver output setup time), switch control signals are generated to activate the first switch to connect the first capacitor to the supply voltage rail, and to deactivate the second and third switches. Thereafter, during a second time period (driving period) subsequent to the first time period, switch control signals are generated to deactivate the first switch and to activate the second and third switches to connect the first and second capacitors in parallel between the output nodes NOUT and N1 and to connect the output node NOUT to an output pad to drive an output load.

These and other exemplary embodiments, aspects, objects, features and advantages of the present invention will become apparent from the following detailed description of exemplary embodiments, which is to be read in connection with the accompanying drawings.

DETAILED DESCRIPTION OF EXEMPLARY EMBODIMENTS

Figure 1:
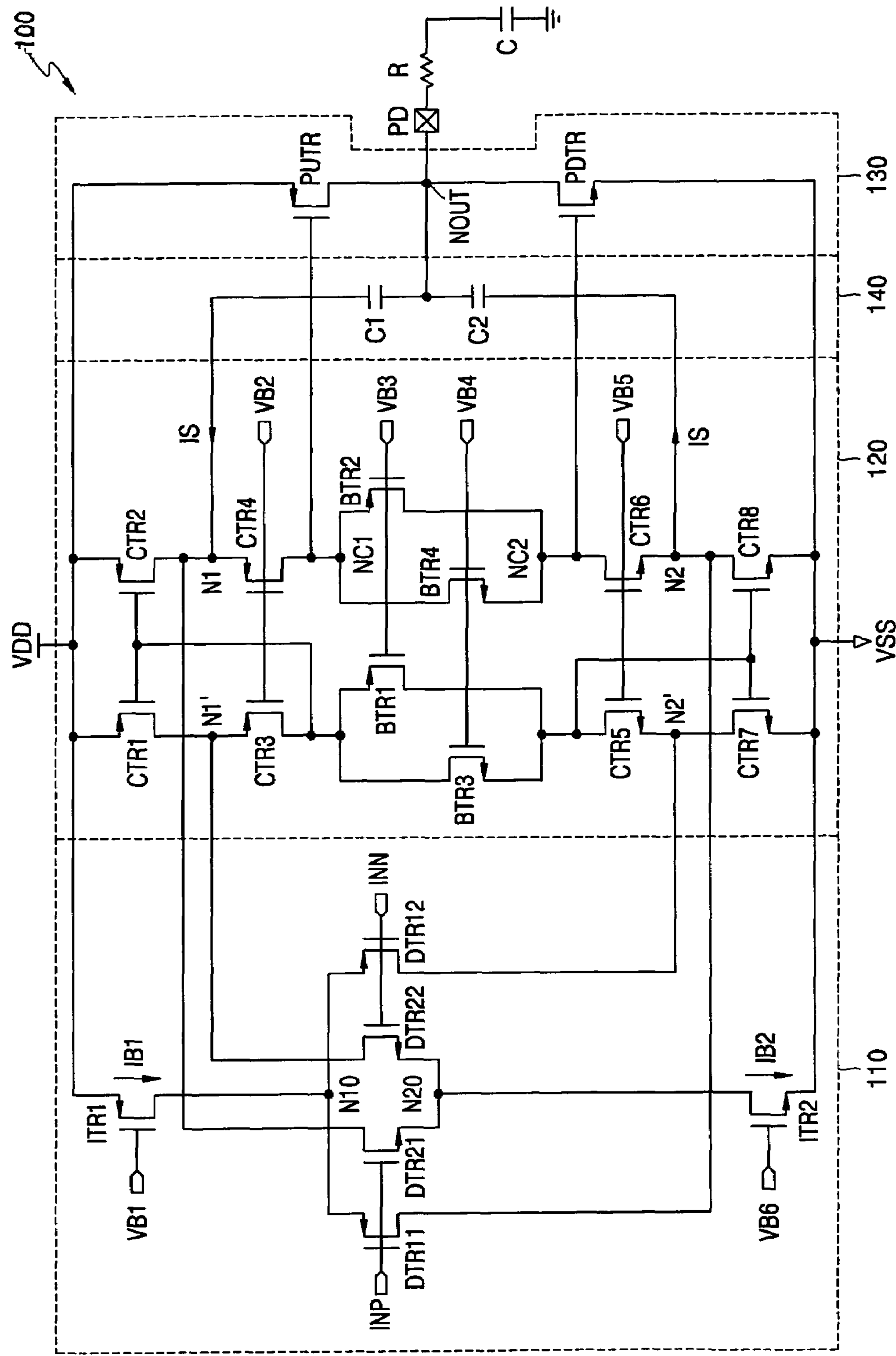
FIG. 1 illustrates a conventional operational amplifier.
Figure 2:
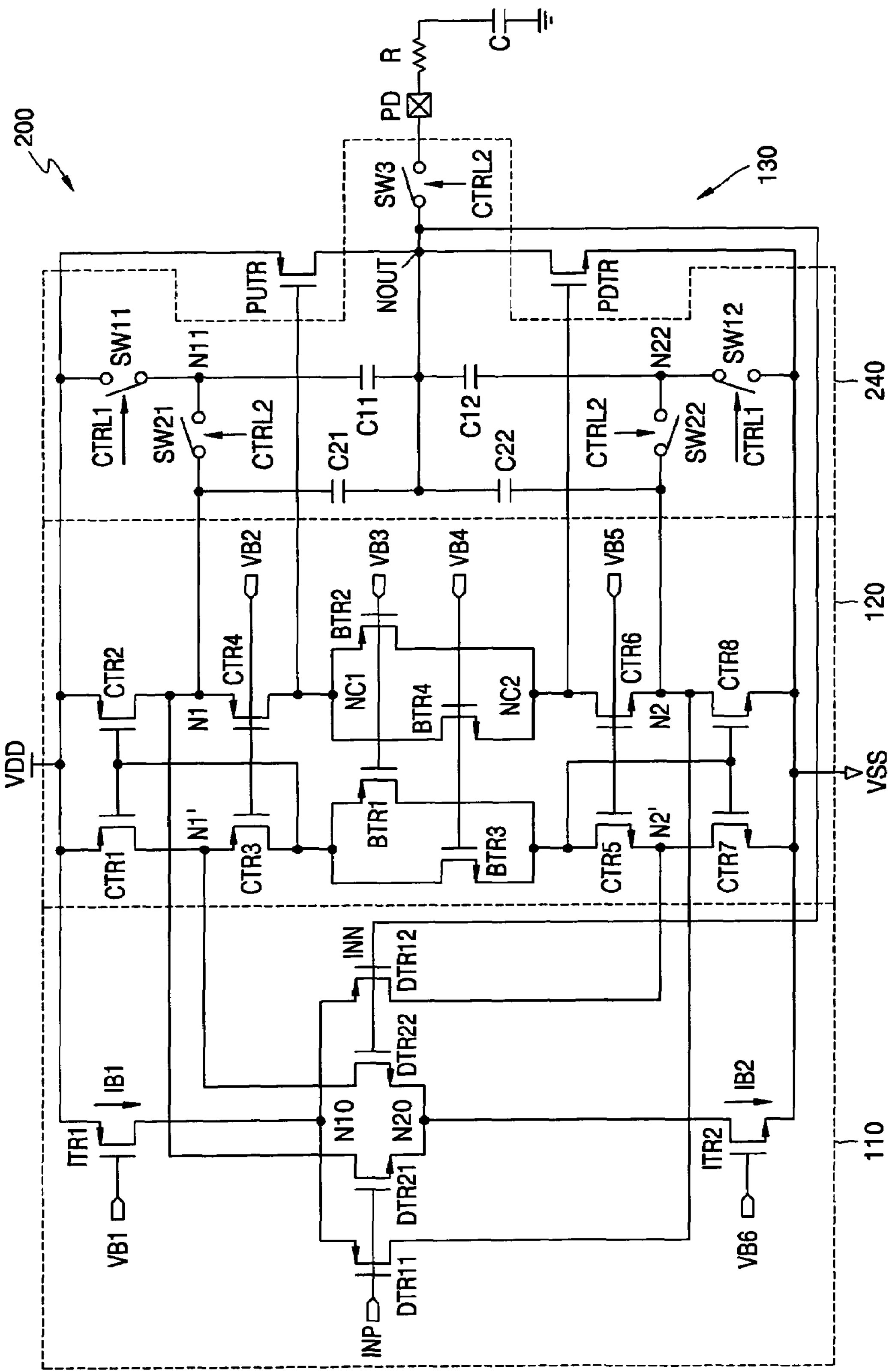
FIG. 2 illustrates an operational amplifier according to an exemplary embodiment of the invention.

FIG. 2 illustrates an operational amplifier (200) according to an exemplary embodiment of the invention. The operational amplifier (200) has a framework similar to the operational amplifier (100) of FIG. 1, except that the operational amplifier (200) comprises a frequency compensation circuit (240) that is designed to improve the slew rate without increasing static power consumption. In general, the operational amplifier (200) comprises a first supply voltage (VDD) rail and a second supply voltage (VSS) rail, a differential amplifier input stage (110) comprising a non-inverting input terminal INP and an inverting signal input terminal INN, a folded cascode stage (120) connected to an output of the differential amplifier input stage (110), and a class AB output driver stage (130) for generating a driving current to drive output node NOUT. The various stages (110, 120 and 130) are similar in architecture and operation to the operational amplifier of FIG. 1 and, thus, a detailed explanation is not needed.

The frequency compensation circuit (240) comprises switches SW11, SW12, SW21, SW22, and SW3 and compensation capacitors C11, C12, C21 and C22. The compensation circuit (240) is connected to nodes N1 and N2 of the folded cascode stage (120) and to the output node NOUT. The output node NOUT is connected in feedback to the inverting input terminal (INN) of the differential amplifier input stage (110). The switch SW11 and the capacitor C11 are serially connected between the VDD supply voltage rail and the output node NOUT. The SW12 and the capacitor C12 are serially connected between the VSS supply voltage rail and the output node NOUT. The switch SW21 is connected to node N1 of the folded cascode stage (120) and a node N11 between the switch SW11 and the capacitor C11. The switch SW22 is connected to node N2 of the folded cascode stage (120) and to a node N22 between the switch SW12 and the capacitor C12. Further, the capacitor C21 is connected between node N1 of the folded cascode stage (120) and the output node NOUT, and the capacitor C22 is connected between node N2 of the folded cascode stage (120) and the output node NOUT. The switch SW3 is connected between the output node NOUT and an output terminal (or pad) PD of the operational amplifier (200).

In the exemplary embodiment of FIG. 2, the switches SW11, SW12, SW21, SW22 and SW3 are selectively activated and deactivated by respective control signals CTRL1 and CTRL2 during certain time periods to change the nodal connections of the various compensation capacitors C11, C12, C21 and C22 in a manner that increases the slew rate while providing stable operation. In essence, the compensation capacitors C11 and C21 in compensation circuit (240) can be viewed, collectively, as the compensation capacitor C1 in compensation circuit (140) of FIG. 1, when the capacitors C11 and C21 are connected in parallel between cascode node N1 and output node NOUT (where C1=C11+C12). Similarly, the compensation capacitors C12 and C22 can be viewed, collectively, as the compensation capacitor C2 in compensation circuit (140) of FIG. 1, when the capacitors C12 and C22 are connected in parallel between cascode node N2 and output node NOUT (where C2=C12+C22). As will be explained below, however, dividing each compensation capacitor C1 and C2 (in FIG. 1) into two separate capacitors C11/C21 and C12/C22, respectively, coupled with dynamic switching control provide a substantial improvement in the slew rate, while maintaining circuit stability and low power dissipation.

An exemplary mode of operation of the operational amplifier (200) with the compensation circuit (240) will now be discussed with reference to the waveform diagrams of FIGS. 5 and 6, wherein it is assumed that the operational amplifier (200) is configured as a unity gain buffer with the output node NOUT connected to the inverting input terminal INN of the differential input stage (110), and wherein input signals are applied to the non-inverting terminal INP. For illustrative purposes, it is further assumed that a time period P (comprising periods P1 and P2) represents a row line scan time for a TFT LCD, wherein time period P1 (t1~t0) represents a fixed, predetermined source driver setup time, and period P2 is the period for driving a source line. As noted above, as the LCDs are designed with higher resolution, the activation periods must be decreased (e.g., period P must be decreased). Consequently, it is preferable to limit the maximum, fixed setup time period P1 that is needed for driving source lines.

Figure 5:
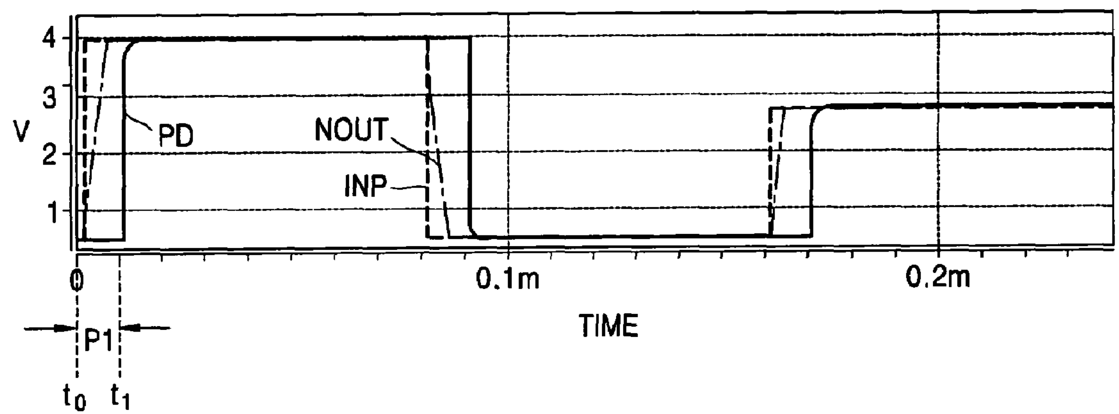
FIG. 5 is an exemplary waveform diagram that illustrates input and output voltages of the operational amplifier of FIG. 2 when configured as a single-ended, non-inverting differential amplifier with unity gain, according to an exemplary embodiment of the invention.
Figure 6:
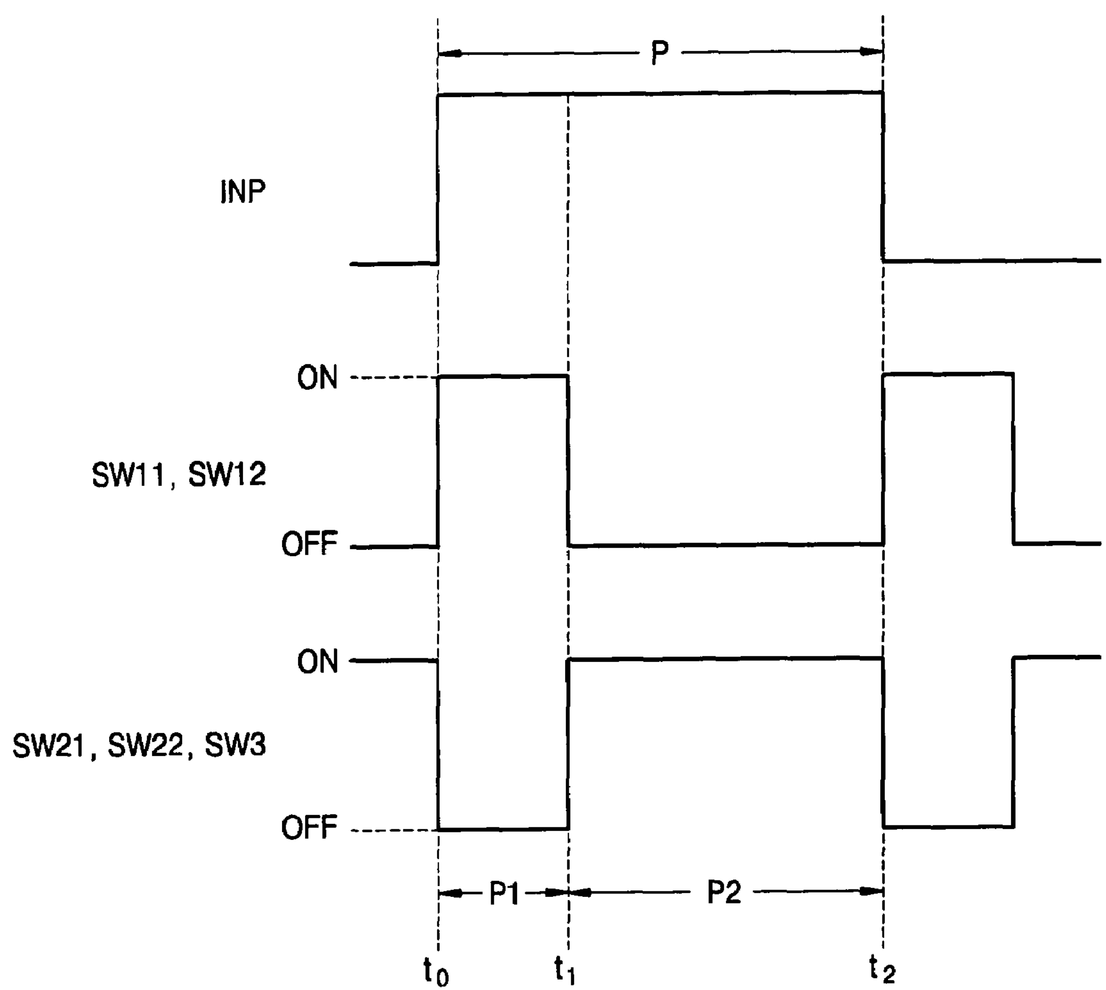
FIG. 6 is a timing diagram that illustrates an exemplary mode of operation of the operational amplifier of FIG. 2, according to an exemplary embodiment of the invention.

Referring now to FIGS. 5 and 6, a differential amplification operation begins at time t0 where an input signal INP is applied to the non-inverting terminal of the input stage (110). Further, at time t0, control signal CTRL1 is asserted to activate (close) switches SW11 and SW12 and the second control signal CTRL2 is de-asserted to deactivate (open) switches SW21, SW22 and SW3. Thus, at time t0, the compensation capacitors C11 and C12 are decoupled from cascode nodes N1 and N2, respectively, and connected to the source (VDD) and ground (VSS) voltage rails, respectively. Moreover, the output node NOUT is decoupled from the capacitive load connected to output pad PD.

At time t0, the compensation circuit (240) is dynamically configured in a state that enables a rapid transition of the output voltage of node NOUT during the period P1 while providing sufficient compensation to maintain circuit stability and prevent oscillation of the output voltage. In particular, during period P1, the small compensation capacitors C11 and C12 are rapidly charged/discharged by current supplied from the source and ground voltages VDD and VSS, and the small compensation capacitors C21 and C22 are readily charged/discharged by the small bias current supplied by nodes N1 and N2. As a result, as depicted in FIG. 5, the output voltage NOUT rapidly transitions to the voltage level of the input voltage INP, thereby providing improved slew rate.

Moreover, during the settling period P1, the compensation capacitors C21 and C22, although small, provide sufficient compensation to maintain stability and prevent oscillation of the output voltage of output node NOUT as a result of feedback. The compensation is realized with smaller capacitors C21 and C22 during period P1 due to the fact that node NOUT is decoupled (via open switch SW3) from the large output capacitive load, and replaced by an effective smaller capacitive load that is realized by small compensation capacitors C11 and C12 essentially acting as small load capacitors (which are smaller than the actual load capacitance) during the settling period, but which are proportionate to the values of C21 and C22 to provide stability.

Referring again to FIGS. 5 and 6, at time t1, upon expiration of the settle period P1, the control signal CTRL1 is de-asserted such that the switches SW11 and SW12 are deactivated (opened), and the second control signal CTRL2 is asserted to activate (close) switches SW21, SW22 and SW3. Thus, at time t1, the output node NOUT is coupled to the output pad PD (coupled to the load). In addition, the compensation capacitors C11 and C12 are decoupled from the supply and ground voltage rails VDD and VSS, respectively, and connected to the cascode nodes N1 and N2, respectively. In this manner, compensation capacitors C11 and C21 are connected in parallel between node N1 and the output node NOUT. Likewise, compensation capacitors C12 and C22 are connected in parallel between node N2 and the output node NOUT.

At time t1, the compensation circuit (240) is dynamically configured in a state to effectively drive the output load with the settled output voltage during period P2 while providing sufficient compensation to maintain circuit stability and prevent oscillation of the output voltage. In particular, at time t1, when the output voltage of node NOUT is coupled to the output pad PD, the stability of the output voltage is maintained from the compensation provided by parallel connected capacitors C11/C21 and C12/C22 such that the output pad voltage PD does not oscillate upon connection to the output node voltage NOUT due to the feedback. Therefore, during period P2, the output load (e.g., source line) can be driven with sufficient compensation capacitance in proportion to the load capacitance to effectively drive the load line.

In the exemplary embodiment of FIG. 2, increased stability is further realized by operating control transistors CTR2 and CTR8 in a weak inversion state such that the overdrive voltage (Vgs-Vth) is virtually 0 volts (very small 20-30 mv). By keeping the overdrive voltage of transistors CTR2 and CTR8 at virtually 0 v, the voltage of node N1 is maintained at almost VDD and the voltage of node N2 is maintained at almost VSS. In such instance, when nodes N1 and N11 are connected by upon activation of switch SW21, the significantly small voltage differential (about 0V) between such nodes will not cause voltage ripple of the output voltage at the start of driving period P2. Likewise, when nodes N2 and N22 are connected by upon activation of switch SW22, the significantly small voltage differential (about 0V) between such nodes will not cause voltage ripple of the output voltage at the start of period P2.

Thus, as demonstrated above, the frequency compensation circuit (240) can be dynamically configured during different periods by controlling the switches to change the connections of the compensation capacitors, to thereby achieve increased slew rate while providing sufficient stability. In the exemplary embodiment of FIG. 2, the switches can be realized using NMOS or PMOS transistors, for example. The ratio of the capacitors C21/C11 and C22/C12 can be selected to provide a desired slew rate and stability. In one exemplary embodiment, C11 and C21 are selected such that the ratio C21/C11=¼ and C22/C12=¼. Moreover, the value the compensation capacitors C11, C21, C12 and C22 can be selected such that C11+C21=C1 and C12+C22=C2, where the capacitance values of C1 and C2 are chosen in a manner the same or similar to the values of compensation capacitors C1 and C2 discussed above with reference to FIG. 1. The operational amplifier (200) can achieve an increased slew rate in an amount of (C11+C22)/C21 as compared to the conventional circuit of FIG. 1.

Figure 3:
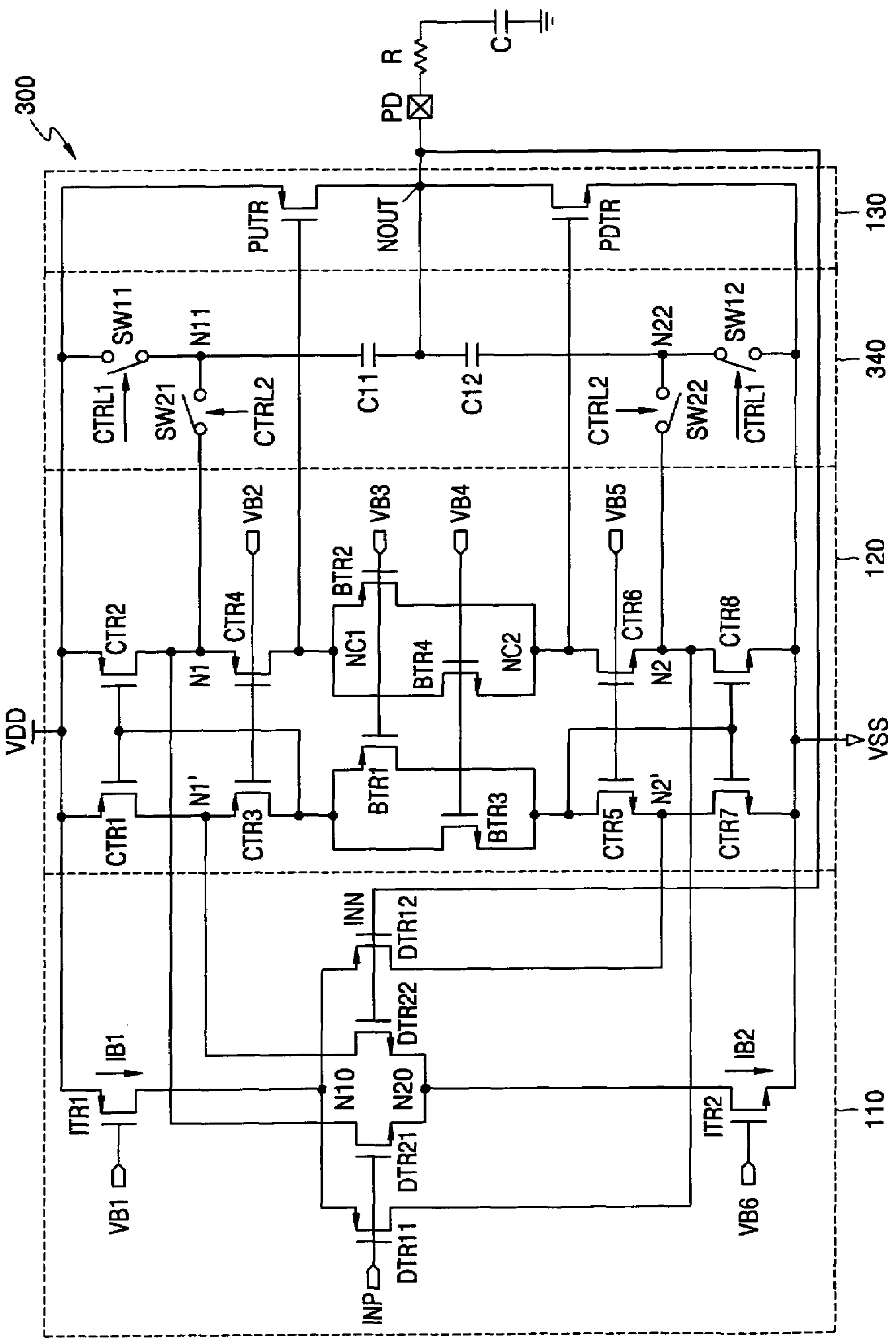
FIG. 3 illustrates an operational amplifier according to another exemplary embodiment of the invention.
Figure 4:
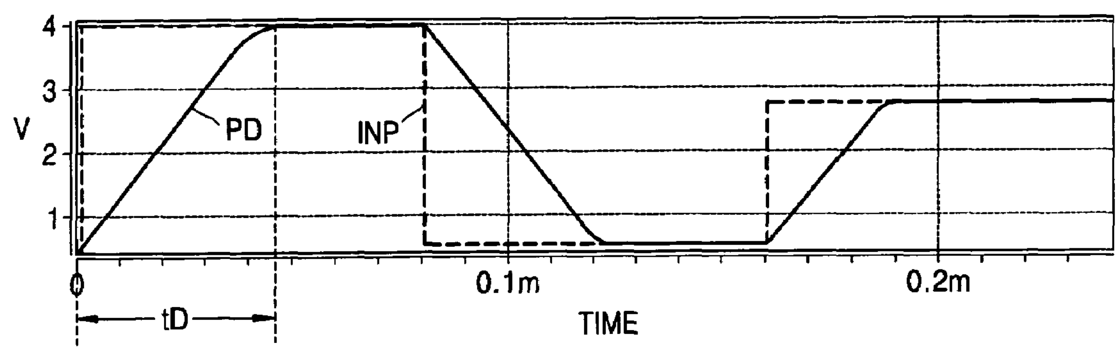
FIG. 4 is an exemplary waveform diagram that illustrates input and output voltages of the operational amplifier of FIG. 1 when configured as a single-ended, non-inverting differential amplifier with unity gain.

FIG. 3 illustrates an operational amplifier (300) according to an exemplary embodiment of the invention. The operational amplifier (300) has a framework similar to the operational amplifier (100) of FIG. 1, except that the operational amplifier (300) comprises a frequency compensation circuit (340) that is designed to improve the slew rate without increasing static power consumption. In general, the operational amplifier (300) comprises a first supply voltage (VDD) rail and a second supply voltage (VSS) rail, a differential amplifier input stage (110) comprising a non-inverting input terminal INP and an inverting signal input terminal INN, a folded cascode stage (120) connected to an output of the differential amplifier input stage (116), and a class AB output driver stage (130) for generating a driving current to drive output node NOUT. The various stages (110, 120 and 130) are similar in architecture and operation to the operational amplifier of FIG. 1 and, thus, a detailed explanation is not needed.

The frequency compensation circuit (340) comprises switches SW11, SW12, SW21 and SW22 and compensation capacitors C1 and C2. The compensation circuit (340) is connected to nodes N1 and N2 of the folded cascode stage (120) and to the output node NOUT. The output node NOUT is connected in feedback to the inverting input terminal (INN) of the differential amplifier input stage (110). The switch SW11 and the capacitor C1 are serially connected between the VDD supply voltage rail and the output node NOUT. The SW12 and the capacitor C2 are serially connected between the VSS supply voltage rail and the output node NOUT. The switch SW21 is connected to node N1 of the folded cascode stage (120) and a node N11 between the switch SW11 and the capacitor C1. The switch SW22 is connected to node N2 of the folded cascode stage (120) and to a node N22 between the switch SW12 and the capacitor C2.

In the exemplary embodiment of FIG. 3, the switches SW11, SW12, SW21 and SW22 are selectively activated and deactivated by respective control signals CTRL1 and CTRL2 during certain time periods to change the nodal connections of the various compensation capacitors C1 and C2 in a manner that increases the slew rate while providing stable operation. An exemplary mode of operation of the operational amplifier (300) with the compensation circuit (340) will now be discussed with reference to the waveform diagram of FIG. 7, wherein it is assumed that the operational amplifier (300) is configured as a unity gain buffer with the output node NOUT connected to the inverting input terminal INN of the differential input stage (110), and wherein input signals are applied to the non-inverting terminal INP. For illustrative purposes, as noted above, it further assumed that a time period P (comprising periods P1 and P2) represents a row line scan time for a TFT LCD, wherein time period P1 (t1~t0) represents a fixed, predetermined source driver setup time, and period P2 is the period for driving a source line.

Figure 7:
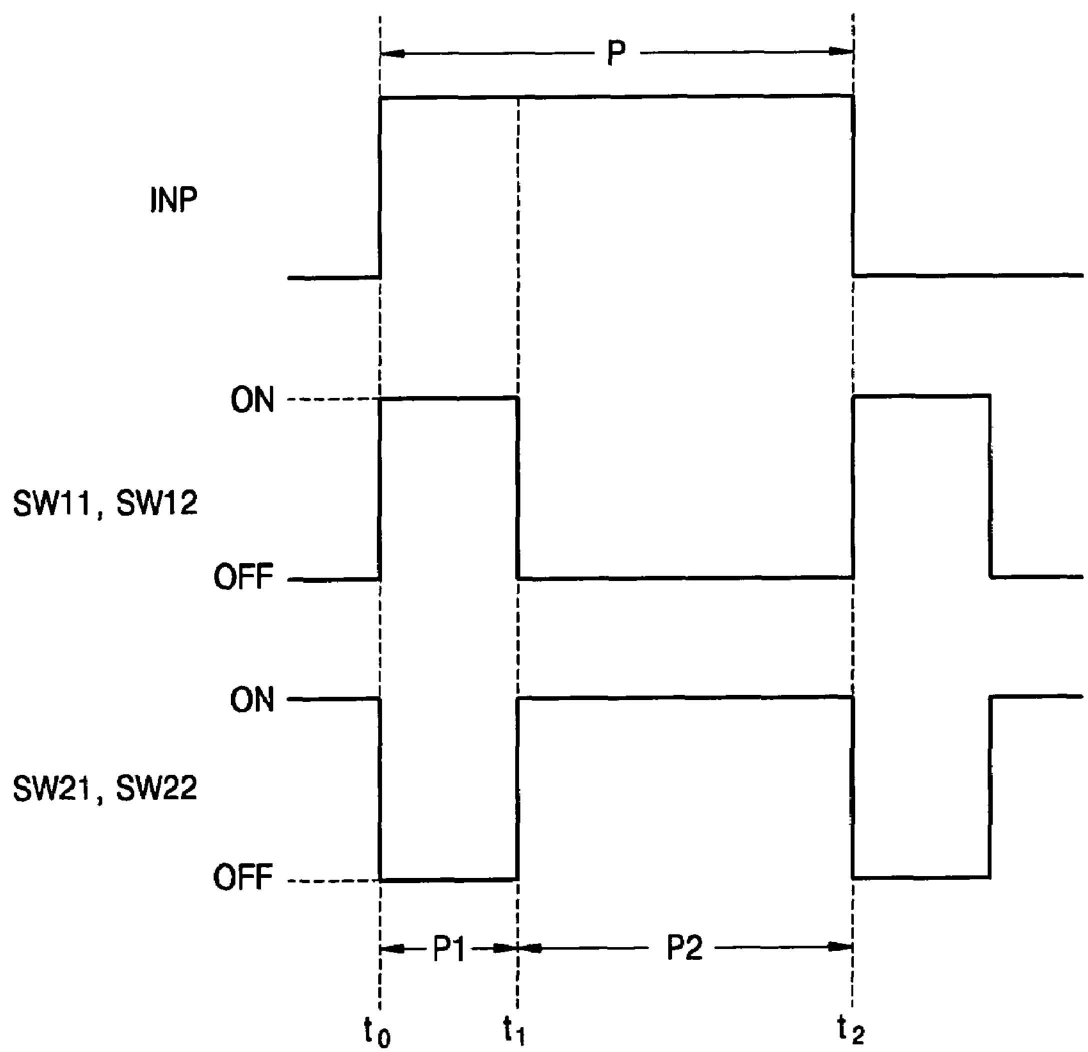
FIG. 7 is a timing diagram that illustrates an exemplary mode of operation of the operational amplifier of FIG. 3, according to an exemplary embodiment of the invention.

Referring to FIG. 7, a differential amplification operation begins at time t0 where an input signal INP is applied to the non-inverting terminal of the input stage (110). Further, at time t0, control signal CTRL1 is asserted to activate (close) switches SW11 and SW12 and the second control signal CTRL2 is de-asserted to deactivate (open) switches SW21 and SW22. Thus, at time t0, the compensation capacitors C1 and C2 are decoupled from cascode nodes N1 and N2, respectively, and connected to the source (VDD) and ground (VSS) voltage rails, respectively.

At time t0, the compensation circuit (340) is dynamically configured in a state that enables a rapid transition of the output voltage of node NOUT during the period P1 as the capacitors C1 and C2 are rapidly charged/discharged by current supplied from the source and ground voltages VDD and VSS, thereby providing improved slew rate. During the period P1, some instability can be realized because of the lack of Miller compensation capacitance connected between the output node NOUT and the cascode nodes N1 and N2.

As further depicted in FIG. 7, at time t1, upon expiration of the settle period P1, the control signal CTRL1 is de-asserted such that the switches SW11 and SW12 are deactivated (opened), and the second control signal CTRL2 is asserted to activate (close) switches SW21 and SW22. Thus, at time t1, the compensation capacitors C1 and C2 are decoupled from the supply and ground voltage rails VDD and VSS, respectively, and connected to the cascode nodes N1 and N2, respectively. Thus, at time t1, the compensation circuit (340) is dynamically configured in a state to effectively drive the output load with the settled output voltage during period P2 while providing sufficient compensation capacitance to maintain circuit stability and prevent oscillation of the output voltage. Although oscillation may occur during period P1 due to lack of miller compensation, the values of capacitors C1 and C2 can be chosen to rapidly dampen the voltage oscillation upon commencement of period P2 when the capacitors C1 and C2 are connected to nodes N1 and N2.

In the exemplary embodiment of FIG. 3, as with the exemplary embodiment of FIG. 2 as discussed above, increased stability is further realized by operating control transistors CTR2 and CTR8 in a weak inversion state such that the overdrive voltage (Vgs-Vth) is virtually 0 volts (very small 20-30 mv). By keeping the overdrive voltage of transistors CTR2 and CTR8 at virtually 0 v, the voltage of node N1 is maintained at almost VDD and the voltage of node N2 is maintained at almost VSS. In such instance, when nodes N1 and N11 are connected by upon activation of switch SW21, the significantly small voltage differential (about 0V) between such nodes will not cause voltage ripple of the output voltage at the start of driving period P2. Likewise, when nodes N2 and N22 are connected by upon activation of switch SW22, the significantly small voltage differential (about 0V) between such nodes will not cause voltage ripple of the output voltage at the start of period P2.

It is to be understood that amplifiers depicted in FIGS. 2 and 3 are merely examples of amplifier circuits which may implement frequency compensation circuits and methods according to exemplary embodiments of the invention. It is to be appreciated that frequency compensation circuits and methods of the invention can be generally applied to maintain stability in various types of multi-stage amplifiers with feedback. By way of example, FIGS. 8 and 9 are high-level schematic illustrations of operational amplifiers according to other exemplary embodiments of the invention.

Figure 8:
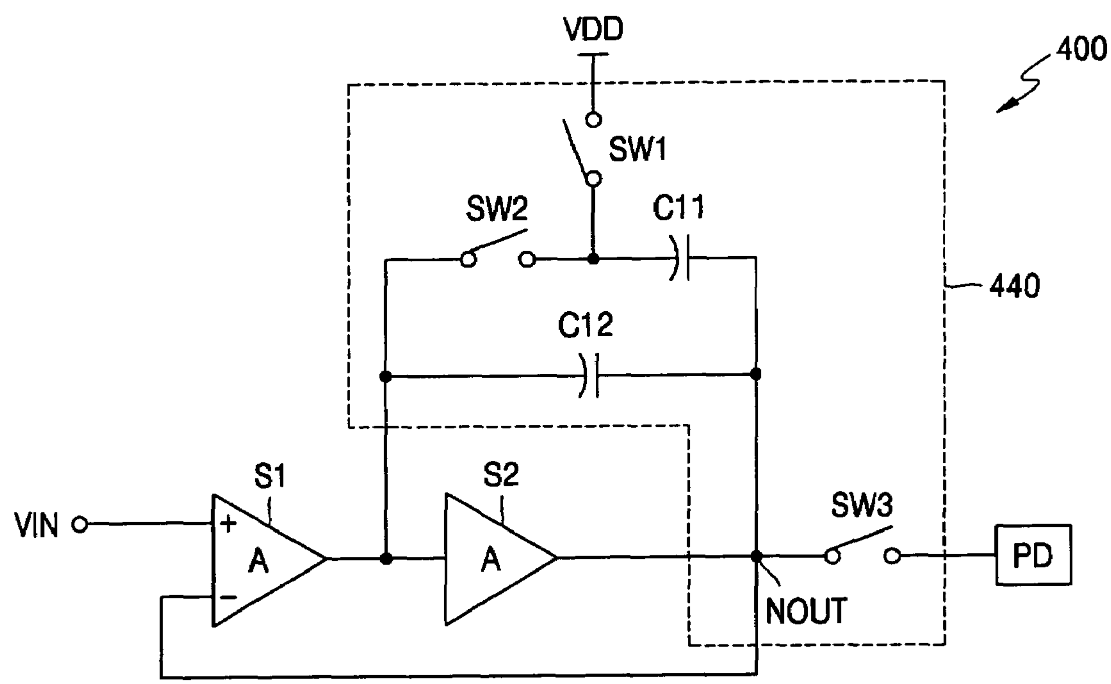
FIG. 8 illustrates an operational amplifier according to another exemplary embodiment of the invention.

In particular, referring to FIG. 8, an operational amplifier (400) comprises a two-stage topology with first and second stages S1 and S2, and a frequency compensation circuit (440) connected between an output node NOUT and an output node (e.g., cascode node) of stage S1. The first stage S1 may comprise a differential input and gain stage (e.g., cascode circuit) having any suitable framework. The second stage may comprise a gain stage (or output stage) with any suitable framework for the desired class of operation (e.g., class AB, Class A, etc.). The output node NOUT is connected to the inverting input terminal of the input stage S1. The frequency compensation circuit (440) comprises compensation capacitors C11 and C12 and switches SW1, SW2 and SW3, and operates to provide frequency compensation and maintain stability of the output voltage as a result of the feedback. The frequency compensation circuit (440) is similar in operation and framework to the frequency compensation circuit (240) of FIG. 2, and thus a detailed explanation is not necessary.

Figure 9:
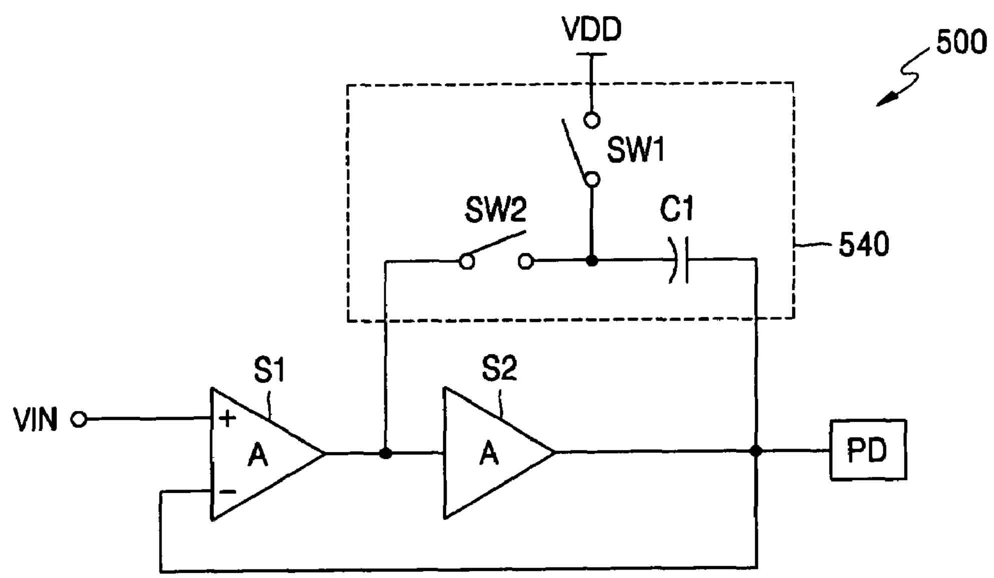
FIG. 9 illustrates an operational amplifier according to another exemplary embodiment of the invention.

Referring to FIG. 9, an operational amplifier (500) comprises a two-stage topology with first and second stages S1 and S2, and a frequency compensation circuit (540) connected between an output node NOUT and an output node (e.g., cascode node) of stage S1. As with the exemplary embodiment of FIG. 8, the first stage S1 may comprise a differential input and gain stage (e.g., cascode circuit) having any suitable framework, and the second stage S2 may comprise a gain stage (or output stage) with any suitable framework for the desired class of operation (e.g., class AB, Class A, etc.). The output node NOUT is connected to the inverting input terminal of the input stage S1. The frequency compensation circuit (540) comprises a compensation capacitor C1 and switches SW1 and SW2, and operates to provide frequency compensation and maintain stability of the output voltage as a result of the feedback. The frequency compensation circuit (540) is similar in operation and framework to the frequency compensation circuit (340) of FIG. 3, and thus a detailed explanation is not necessary.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention. All such changes and modifications are intended to be included within the scope of the invention as defined by the appended claims.

I claim:

1. An operational amplifier, comprising:

a first supply voltage rail;

a second supply voltage rail;

a differential amplifier input stage comprising a first signal input terminal and a second signal input terminal;

a folded cascode stage connected to an output of the differential amplifier input stage, the folded cascode stage comprising first, second, third and fourth nodes;

an output driver stage for generating a driving current to an output node of the operational amplifier, the output driver stage comprising first and second output transistors connected to the first and second nodes, respectively, of the folded cascode stage; and a compensation circuit connected to the third and fourth nodes of the folded cascode stage and to the output node of the operational amplifier, wherein the output node is connected to the second signal input terminal of the differential amplifier input stage, wherein the compensation circuit comprises:

a first and second capacitor; and a first, second, third and fourth switch;

wherein the first switch and the first capacitor are serially connected between the first supply voltage rail and the output node, wherein the second switch and the second capacitor are serially connected between the second supply voltage rail and the output node;

wherein the third switch is connected to the third node of the folded cascode stage and to a node between the first switch and the first capacitor; and wherein the fourth switch is connected to the fourth node of the folded cascode stage and to a node between the second switch and the second capacitor.

2. The operational amplifier of claim 1, wherein the compensation circuit further comprises a third capacitor connected between the third node of the folded cascode stage and the output node, and a fourth capacitor connected between the fourth node of the folded cascode stage and the output node.

3. The operational amplifier of claim 2, wherein the compensation circuit further comprises a fifth switch connected between the output node and an output terminal of the operational amplifier.

4. The operational amplifier of claim 3, further comprising a control circuit to generate a plurality of switch control signals when an input signal is input to the first signal input terminal of the differential amplifier input stage;

wherein during a first time period, switch control signals are generated to activate the first and second switches to connect the first and second capacitors to the first and second supply voltage rails, respectively, and to deactivate the third and fourth and fifth switches; and wherein during a second time period subsequent to the first time period, switch control signals are generated to deactivate the first and second switches and to activate the third and fourth and fifth switches to connect the first and third capacitors in parallel between the third node of the folded cascode stage and the output terminal, and to connect the second and fourth capacitors in parallel between the fourth node of the folded cascode stage and the output terminal.

5. The operational amplifier of claim 1, further comprising a control circuit to generate a plurality of switch control signals when an input signal is input to the first signal input terminal of the differential amplifier input stage, wherein during a first time period, switch control signals are generated to activate the first and second switches to connect the first and second capacitors to the first and second supply voltage rails, respectively, and deactivate the third and fourth switches; and wherein during a second time period subsequent to the first time period, switch control signals are generated to deactivate the first and second switches and to activate the third and fourth switches to connect the first and second capacitors to the third and fourth nodes of the folded cascode stage, respectively.

6. An operational amplifier, comprising:

a first differential amplifier input stage having an output node N1;

a second stage having an input node and an output node, wherein the input node of the second stage is coupled to the output node N1 and wherein the output node of the second is an output node NOUT of the operational amplifier, wherein the second stage drives an output voltage on the output node NOUT; and a frequency compensation circuit connected between the output node NOUT and the output node N1 of the first differential amplifier input stage; wherein the frequency compensation circuit comprises:

a first capacitor; and a first and second switch;

wherein the first switch and the first capacitor are serially connected between a supply voltage rail and the output node NOUT; and wherein the second switch is connected to the output node N1 and to a node between the first switch and the first capacitor such that the second switch and first capacitor are serially connected between the output nodes N1 and NOUT and serially connected in parallel to the second stage.

7. The operational amplifier of claim 6, further comprising a control circuit to generate a plurality of switch control signals when an input signal is input to a first input terminal of the differential amplifier input stage, wherein during a first time period, switch control signals are generated to activate the first switch to connect the first capacitor to the supply voltage rail, and deactivate the second switch; and wherein during a second time period subsequent to the first time period, switch control signals are generated to deactivate the first switch and to activate the second switch to connect the first capacitor to the output node N1.

8. The operational amplifier of claim 7, wherein the first time period is a predetermined source driver setup time, and the second time period is a fixed time period for driving a source line in an LCD panel.

9. The operational amplifier of claim 6, wherein the first differential amplifier input stage comprises a differential amplifier and a folded cascode gain stage to amplify an output current of the differential amplifier.

10. The operational amplifier of claim 9, wherein the first capacitor is connected between the output nodes NOUT and N1 to provide cascoded miller frequency compensation.

11. The operational amplifier of claim 6, wherein the first and second stages provide rail-to-rail common mode range of operation.

12. An operational amplifier, comprising:

a first differential amplifier input stage;

a second stage having an output node NOUT; and a frequency compensation circuit connected between the output node NOUT and an output node N1 of the first differential amplifier input stage; wherein the frequency compensation circuit comprises:

a first capacitor; and a first and second switch;

wherein the first switch and the first capacitor are serially connected between a supply voltage rail and the output node NOUT; and wherein the second switch is connected to the output node N1 and to a node between the first switch and the first capacitor, wherein the compensation circuit further comprises:

a second capacitor connected between the output nodes NOUT and N1; and a third switch connected between the output node NOUT and an output terminal of the operational amplifier.

13. The operational amplifier of claim 12, further comprising a control circuit to generate a plurality of switch control signals when an input signal is input to a first input terminal of the differential amplifier input stage;

wherein during a first time period, switch control signals are generated to activate the first switch to connect the first capacitor to the supply voltage rail, and to deactivate the second and third switches; and wherein during a second time period subsequent to the first time period, switch control signals are generated to deactivate the first switch and to activate the second and third switches to connect the first and second capacitors in parallel between the output nodes NOUT and N1 and to connect the output node NOUT to an output pad to drive an output load.

14. The operational amplifier of claim 13, wherein the first time period is a predetermined source driver setup time, and the second time period is a fixed time period for driving a source line in an LCD panel.

15. A method for generating an output voltage of an operational amplifier for driving a load, comprising the steps of:

differentially amplifying a data signal input to a non-inverting input terminal of the operational amplifier and a feedback signal input to an inverting input terminal of the operational amplifier, wherein the feedback signal is an output voltage of an output node NOUT of the operational amplifier; and driving the output node NOUT to a driving output voltage using a differentially amplified signal which is generated at an output node N1 of a gain stage and coupled to an input node of an output driver stage, wherein driving the output node NOUT comprises;

switchably coupling a first compensation capacitor between a supply voltage rail and the output node NOUT of the operational amplifier during an output driver setup period to charge or discharge the compensation capacitor and drive the output node NOUT to a desired driving output voltage with the first compensation capacitor decoupled from the input node of the output driver stage; and switchably coupling the first compensation capacitor between the output node N1 of the gain stage and the output node NOUT to provide frequency compensation during a driving period in which the driving output voltage is applied to drive an output load with the first compensation capacitor decoupled from the supply voltage rail.

16. The method of claim 15, wherein the gain stage comprises a folded cascode circuit connected to an output of a differential amplifier.

17. A method for generating an output voltage of an operational amplifier for driving a load, comprising the steps of:

differentially amplifying a data signal input to a non-inverting input terminal of the operational amplifier and a feedback signal input to an inverting input terminal of the operational amplifier, wherein the feedback signal is an output voltage of an output node NOUT of the operational amplifier;

coupling a first compensation capacitor between a supply voltage rail and the output node NOUT of the operational amplifier during an output driver setup period to charge or discharge the compensation capacitor and drive the output node NOUT to a desired driving output voltage;

coupling the first compensation capacitor between an output node N1 of a gain stage and the output node NOUT to provide frequency compensation during a driving period in which the driving output voltage is applied to drive an output load;

decoupling the output node NOUT from an output pad connected to the output load during the output driver setup period; and coupling the output node NOUT to the output pad during the driving period.

18. The method of claim 17, further comprising:

providing frequency compensation during the output driver setup period using a second compensation capacitor connected between the output nodes NOUT and N1; and connecting the first and second compensation capacitors in parallel between the output nodes NOUT and N1 during the driving period to provide frequency compensation when driving the output load.

19. The method of claim 18, wherein the first compensation capacitor has a capacitance that is larger than a capacitance of the second compensation capacitor.

20. The method of claim 17, further comprising driving a source line of an LCD panel using the driving output voltage.

* * * * *